(12) United States Patent
Fryčák (10) Patent No.: US 10,317,450 B2
(45) Date of Patent: Jun. 11, 2019

(54) METHOD FOR MEASURING QUICK CHANGES IN LOW SURFACE CONDUCTIVITY OF DIELECTRICS UNDER ELECTROMAGNETIC INTERFERENCE OF LINE VOLTAGE AND EQUIPMENT TO PERFORM THIS TYPE OF MEASUREMENT

(71) Applicant: Palacky University Olomouc, Olomouc (CZ)

(72) Inventor: Petr Fryčák, Chomutov (CZ)

(73) Assignee: Palacky University Olomouc, Olomouc (CZ)

( * ) Notice: Subject to any disclaimer, the term of this patent is extended or adjusted under 35 U.S.C. 154(b) by 0 days.

(21) Appl. No.: 15/635,427

(22) Filed: Jun. 28, 2017

(65) Prior Publication Data
US 2018/0003758 A1  Jan. 4, 2018

(30) Foreign Application Priority Data
Jun. 30, 2016  (CZ) .................................... 2016-398

(51) Int. Cl.
*G01R 31/00* (2006.01)
*G01R 27/02* (2006.01)
*G01R 27/26* (2006.01)

(52) U.S. Cl.
CPC .......... *G01R 31/001* (2013.01); *G01R 27/02* (2013.01); *G01R 27/025* (2013.01); *G01R 27/2617* (2013.01)

(58) Field of Classification Search
CPC ................................................... G01R 31/001
See application file for complete search history.

(56) References Cited

U.S. PATENT DOCUMENTS

2013/0103335 A1* 4/2013 Schneegans ........... B82Y 35/00
702/65

* cited by examiner

*Primary Examiner* — Clayton E. LaBalle
*Assistant Examiner* — Jas A Sanghera
(74) *Attorney, Agent, or Firm* — Luoh J. Wu; Continent Patent Office LLP (57) ABSTRACT

The method for measuring of quick changes of low surface conductivity of dielectrics under electromagnetic interference of line voltage is based on a comparison measurement on a voltage divider and synchronization of measuring pulses with periodic sinusoidal course of interference when voltage with pre-set parameters of square pulse is brought to the tested dielectric surface and potential is sampled in the voltage divider consisting of the measured dielectric surface and a resistor with preselected resistivity in certain time intervals both before application of the measuring pulse and immediately before its end, and then based on a difference between the values measured using a differential amplifier, the value corresponding to that measured without effect of electromagnetic interference 60 Hz is derived and the result is the possibility to measure quick changes of low surface conductivity of dielectric surface.

6 Claims, 10 Drawing Sheets

METHOD FOR MEASURING QUICK CHANGES IN LOW SURFACE CONDUCTIVITY OF DIELECTRICS UNDER ELECTROMAGNETIC INTERFERENCE OF LINE VOLTAGE AND EQUIPMENT TO PERFORM THIS TYPE OF MEASUREMENT

This application claims the benefit of Czech republic application number: PV 2016-398 filed on Jun. 30, 2016. The content of this document and the entire disclosure of publications, patents, and patent documents mentioned herein are incorporated by reference.

AREA OF TECHNOLOGY

The invention applies to a method for measuring quick changes of low surface conductivity of dielectrics under electromagnetic interference of line voltage and to equipment to perform this type of measurement in the measuring fields where it is necessary to register changes in low conductivity of dielectrics with high sensitivity, and also with quick response using low amplitude pulses even under conditions of electromagnetic interference with line voltage frequency.

STATE OF THE ART

When the surface conductivity is to be measured, electrodes are positioned on the planar surface of the material and it is expected that the electric current runs just on the surface and in a very thin subsurface layer of the material. After direct current (DC) voltage is applied on the electrodes, the time course of the running electric current depends on the quality and density of present movable charge carriers, magnitude of voltage between the electrodes, on time since the voltage was applied and other parameters like temperature and surface moisture. The procedures and equipment used to measure surface conductivity have been described in standards ASTM D257 (Test Methods for DC Resistance or Conductance of Insulating Materials) and ANSI/ESD STM11.11 (Surface Resistance Measurement of Static Dissipative Planar Materials) and other materials. These standards particularly apply to one-shot finding of conductivity to characterise various materials and products where the time for measurement is not a critical parameter and no change of conductivity is expected during the measurement. When the measurement is performed according to the standard ASTM D257 voltage 500 V is applied on the tested surface for 60 s.

Generally, we can approximate behaviour of surface of dielectric materials under step application of electric voltage as parallel-serial circuit with one capacitor and two resistors (for equivalent circuit see FIG. 1), i.e. the magnitude of the electric current related to orientation of dipoles and the movement of free charge carriers towards the electrodes decreases exponentially from its starting value to some residual level where it stabilises (this permanent current consists just of the charge carriers that are able to cross the boundary between the dielectric and electrodes with applied voltage). Depending on applied voltage (several volts and more) also unrequired electrochemical changes can occur on the electrodes through which the voltage passes to the examined surface. Therefore, it is advisable to use a pulse arrangement when measuring conductivity because relatively high electric current (easier to register when its magnitude is generally low) is measured for adequately short voltage pulses and uniform distribution of movable charge carriers on dielectric surface recovers in the period between applied pulses which means that the magnitude of running current does not decrease when other voltage pulses are applied. Electrochemical changes on electrodes can be prevented when applying voltage pulses with the lowest possible amplitude.

Figure 1:
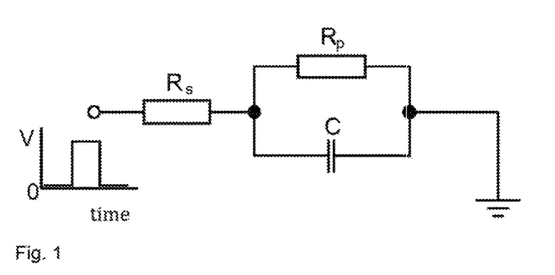
FIG. 1. Equivalent electric diagram of dielectric surface.
Figure 2:
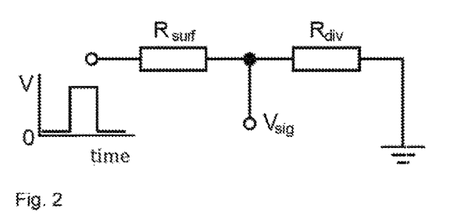
FIG. 2. Principle of measurement of surface resistivity using resistor voltage divider in pulse arrangement.

In case that the duration of the applied voltage pulses (and the period between the pulses) is much shorter than the time factor $R_s*C$ in FIG. 1, the surface resistivity for DC current $R_{surf}$ can be put equal to resistivity $R_s$ ($R_{surf} \equiv R_s$). The magnitude of the current passing on surface as response to the known applied voltage (and thus surface resistivity and/or conductivity) can be registered when the examined surface is connected in series with resistor $R_{div}$ as potential on a voltage divider $V_{sig}$ (FIG. 2).

If pulse potential is $V_p$ (against earth which has zero potential by definition), then magnitude $V_{sig}$ during the pulse duration is $$V_{sig} = \frac{R_{div}}{R_{surf} + R_{div}} V_p \qquad (1)$$

The sensitivity of surface conductivity measurement (s) in a circuit with a voltage divider (FIG. 2) has been defined as change of potential $V_{sig}$ with changing surface resistivity $R_{surf}$ (decrease of surface resistivity will result in $V_{sig}$ increase; the negative sign is in the definition for the sensitivity to appear as positive quantity)

$$s \equiv -\frac{dV_{sig}}{dR_{surf}} \qquad (2)$$

When we insert (1) into (2) we get (providing $R_{div}$ is constant)

$$s = -R_{div}V_p \frac{d}{dR_{surf}}\left(\frac{1}{R_{surf} + R_{div}}\right) = \frac{R_{div}V_p}{(R_{surf} + R_{div})^2} \qquad (3)$$

The criterion for selection of resistivity $R_{div}$ of the divider for given value $R_{surf}$ is the sensitivity of the equipment. The maximum sensitivity can be expected where the derivative of sensitivity with respect to $R_{div}$ equals to zero:

$$\frac{ds}{dR_{div}} = \frac{R_{surf} - R_{div}}{(R_{surf} + R_{div})^2} V_p = 0 \qquad (4)$$

Figure 3:
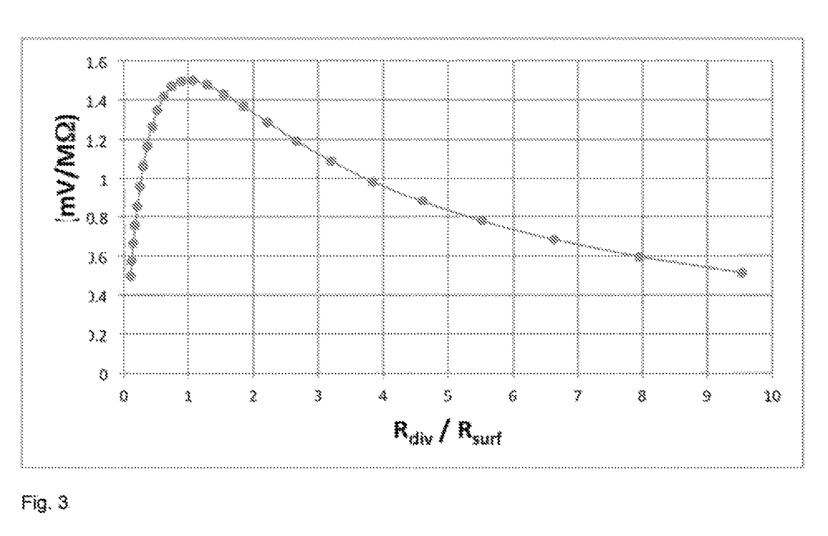
FIG. 3. Calculated sensitivity of voltage divider for various values $R_{div}$ for $R_{surf}$=50 MΩ and $V_p$=300 mV.

The equality (4) is satisfied for $R_{div}=R_{surf}$. This is also documented in the calculated dependence of sensitivity on ratio $R_{div}/R_{surf}$ for $R_{surf}=50$ MΩ and pulse amplitude $V_p=300$ mV (see FIG. 3).

From sensitivity of the equipment point of view, it is evident that the higher surface resistivity (i.e. the lower conductivity), the higher resistivity $R_{div}$ should be in the voltage divider so that the equipment is best able to reflect the changes in the surface conductivity.

Figure 4:
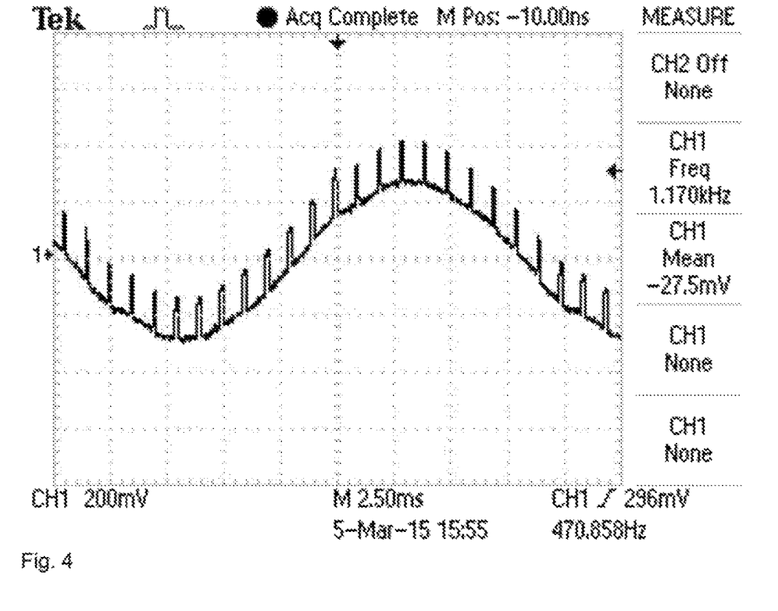
FIG. 4. Oscilloscopic record of $V_{sig}$ for measurement according to FIG. 2 on pulse frequency approximately 1 kHz, amplitude $V_p$=300 mV and $R_{div}$=$R_{surf}$=10 MΩ.

When we try to get the highest possible sensitivity for surfaces with low conductivity thus high resistivity $R_{surf}$ and thus, when using high resistivity $R_{div}$ in the divider (megaohms—tens of megaohms), the measurement is affected by electromagnetic interference (EMI) propagating through space from various sources and in various frequencies. The key element is interference in frequency 60 Hz from electric main lines 230 V. This interference is up to hundreds of millivolts and in combination with high resistivity of the surface measured it can cause signal jitter to such an extent that the measurement of surface conductivity is not feasible in the above arrangement if measuring pulses of low amplitude (mV hundreds) are used (FIG. 4 presents oscilloscopic record of $V_{sig}$ for measurement according to FIG. 2 at pulse frequency approximately 1 kHz, amplitude $V_p$=300 mV and $R_{div}$=$R_{surf}$=10 MΩ; the pulses monitored in the divider have been superposed on a sinusoidal curve 60 Hz EMI with the amplitude at approximately 250 mV). The measurement with a high noise level in the background can be performed after signal modulation using a lock-in amplifier but such a solution slows down the response of the measuring equipment.

SUMMARY OF THE INVENTION

This drawback is removed when such measurement of quick changes of low surface conductivity of dielectrics under electromagnetic interference of line voltage is used that is based on measurement a comparison measurement on the voltage divider and synchronisation of measuring pulses with periodic sinusoidal interference curve when voltage with predetermined parameters of square pulse is applied on the tested surface of dielectric, and the potential on the voltage divider that consists of the tested surface of dielectric and a resistor with preselected resistivity is sampled in certain time intervals both before application of the measuring pulse and just before its end, and then the value corresponding to the value measured without effect of the electromagnetic interference 60 Hz EMI is acquired based on difference of quantities measured with the differential amplifier where the result is the determination of quick changes of low surface conductivity of dielectric surface.

It is advantageous when the measuring pulses are voltage ones with parameters of square pulse with duration 1 ms in each positive semi-period 60 Hz EMI.

The above drawback addressed through measurement of quick changes of low surface conductivity of dielectrics under electromagnetic interference of line voltage has been removed using equipment for measurement of quick changes of low surface conductivity of dielectrics under electromagnetic interference of line voltage based on measurement of quick changes of low surface conductivity of dielectrics, that is based on the fact that a block for monitoring electromagnetic interference is connected to the sensing element for monitoring of electromagnetic interference, and the first output of the block is connected to a comparative block for control of generation of time sequences and to a block for generation of pulses that produces square pulses 1 ms/±5 V, then the first output 10 μs/±5 V and the second output 10 μs/±5 V are connected to the inputs of the block of logic elements, and another output of the block for monitoring electromagnetic interference is connected to a comparator the output of which is connected to the fourth input of the block of logic elements, and the first output of the block of logic elements is connected through a modulation block with output pulse 0 to 300 mV to the tested surface in the block of the voltage divider surface/resistor of the divider where output from this block of the voltage divider surface/resistor of the divider is connected through a voltage follower with very high input impedance to signal inputs of the first sample-and-hold amplifier and of the second sample-and-hold amplifier where the second input for control of sampling of the first sample-and-hold amplifier and the second input for control of sampling of the second sample-and-hold amplifier are connected with corresponding outputs for control of sampling of the block of logic elements where the output of the first sample-and-hold amplifier is connected through the first inverting amplifier and the second inverting amplifier to the inverting input of the differential amplifier, an output of the second sample-and-hold amplifier is connected to its non-inverting input, and the differential amplifier is connected to the output of the equipment through a low past filter to eliminate accidental fluctuations of the signal.

It is advantageous when the sensing element is a resistor connected to the input of the block monitoring electromagnetic interference, and possibly it is advantageous when the sensing element is a transformer connected with its primary winding to the mains voltage while the secondary winding is connected with one terminal to earthing of the equipment and with the other terminal to the input of the block monitoring electromagnetic interference.

Figure 5:
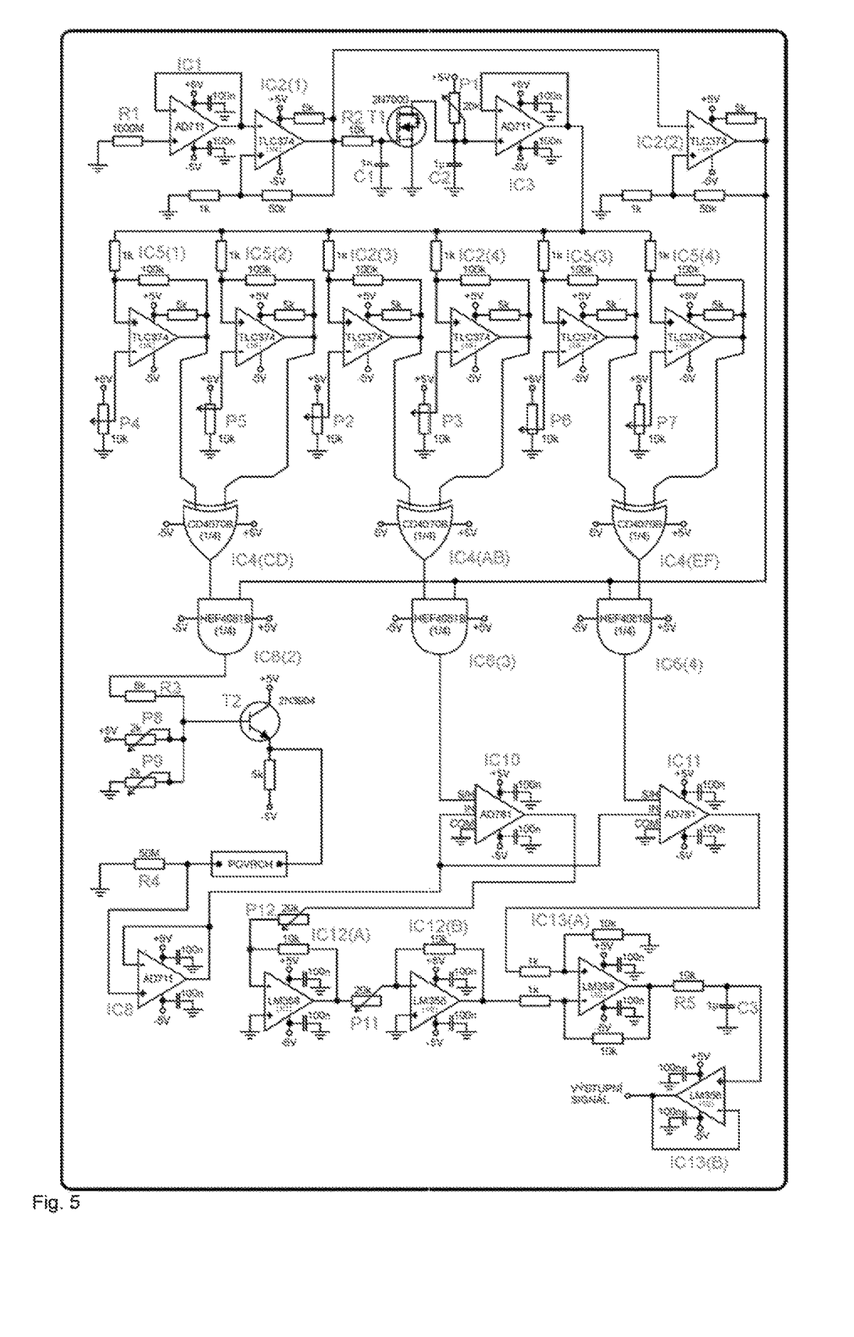
FIG. 5. Electrotechnical diagram of exemplary actual arrangement of the suggested equipment.

It is also advantageous when the equipment for the measurement of quick changes of low surface conductivity of dielectrics under electromagnetic interference of line voltage is solved using interconnection of specific electronic and electrotechnical elements, as presented in FIG. 5.

The device proposed (DP) for the measurement of quick changes of low surface conductivity of dielectrics under electromagnetic interference of line voltage allows to register changes in low surface conductivity of dielectrics with high sensitivity using voltage pulses of low amplitude and, at the same time, with quick response also under conditions of electromagnetic interference with line voltage frequency 60 Hz.

EXAMPLE OF EXECUTION OF THE INVENTION

The solution suggested will be described in activity and function of the equipment for measurement of quick changes of low surface conductivity of dielectrics under electromagnetic interference of line voltage based on the method to measure quick changes of low surface conductivity of dielectrics the electrical diagram of which using specific electrical components from the current parts supply offered in the market is presented in FIG. 5 and which was successfully tested under operational conditions.

The equipment is based on a voltage divider and synchronisation of measuring pulses with periodical sinusoidal course of interference effects. A square pulse with duration 1 ms in each positive semi-period 60 Hz EMI is applied on the tested surface and the potential in the divider is sampled both immediately before application of the measuring pulse and just before its end. The difference between these two readings is acquired using a differential amplifier, and it is close to the reading that would be found in environment free off 60 Hz EMI.

The function of the equipment is subsequently explained with regard to the chronological order starting at the moment when positive semi-period 60 Hz EMI (t=0) begins.

Electromagnetic interference 60 Hz is followed in the first resistor R1 with high resistivity (1000 MΩ) using the first voltage follower IC1 with very high input impedance (of order $10^{12}$ Ω). Output from the first follower IC1 is connected to inverting input of the first comparator IC2-1; zero voltage is brought to its non-inverting input. Thus, the first comparator IC2-1 switches to low output level (−5V) in time t=0. The result is as follows:

Switch of the eighth comparator IC2-2 from low output level to the high one, and this is brought to one of two inputs of the logic elements IC6-2, IC6-3 and IC6-4AND.

Gradual change of voltage on the first capacitor C1 from +5V to −5V with time factor R2*C1 (i.e. 10 μs).

After certain time the voltage on electrode gate of transistor T1 MOSFET will drop so much because of discharge of the first capacitor C1, that the transistor will close. This results in gradual change of voltage on the second capacitor C2 from 0V to +5V with time factor P1*C2. Two periods of voltage run in the first voltage follower IC1 (i.e. course of 60 Hz EMI), the first comparator IC2-1, the gate transistor T1MOSFET, the eighth comparator IC2-2 and the second capacitor C2 (presented as output from the second voltage follower IC3 where the second capacitor C2 is connected) are drawn in FIG. 6 (recorded by USB DAQ modul Tedia UDAQ-1408E).

Figure 6:
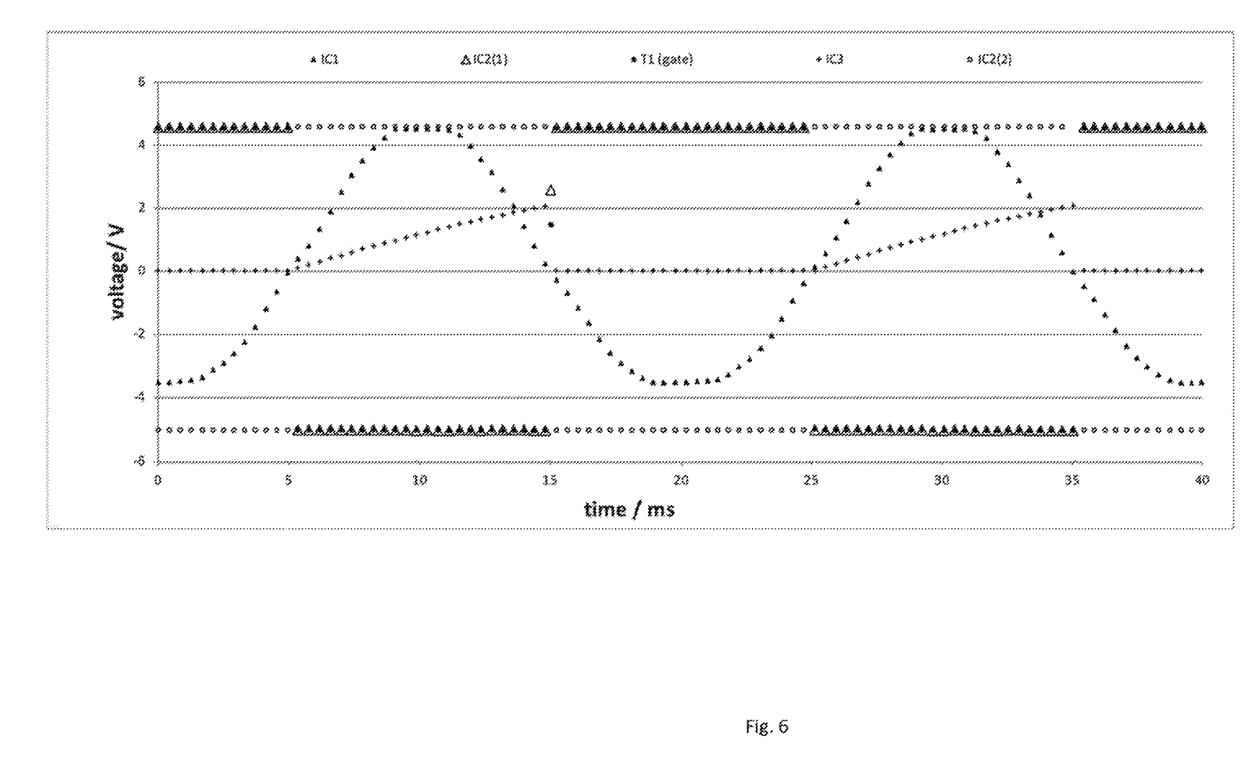
FIG. 6. Course of voltage in outputs of comparators IC2-1 and IC2-2, operation amplifiers IC1 and IC3 (follows voltage on second capacitor C2) and on gate of transistor T1 MOSFET).

The voltage curves in FIG. 6 have been measured with the sampling gap 0.206 ms, and therefore they do not show a small difference in voltage curves between the electrode of the gate transistor T1 MOSFET and outputs from the first comparator IC2-1 and of the eighth comparator IC2-2 which is essential for the right operation—for explanation see below.

The voltage on the second capacitor C2 is brought to non-inverting inputs of comparators IC2-3,IC2-4,IC5-1, IC5-2,IC5-3 and IC5-4 through the second voltage follower IC3. Potentiometers P2 to P7 set various voltage levels in their inverting inputs which controls the time sequence for switching these comparators IC2-3,IC2-4,IC5-1,IC5-2, IC5-3 and IC5-4.

Figure 7:
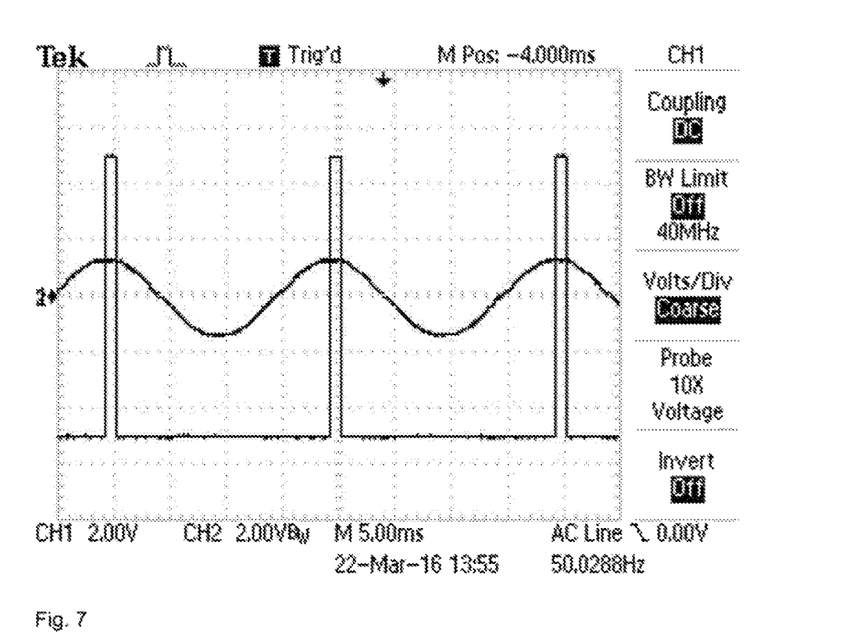
FIG. 7. Oscilloscopic record of outputs of the first voltage follower IC1 (sine curve) and logic element IC4-CD XOR (square pulses).

The fourth potentiometer P4 is set in such a way that the second comparator IC5-1 switches to the high output level in some preselected phase of positive semi-period 60 Hz EMI, e.g. on semi-period maximum but this is not necessary. The fifth potentiometer P5 is set in such a way that the third comparator IC5-2 switches to the high output level 1 ms after switch of the second comparator IC5-1. The outputs from these comparators IC5-1 and IC5-2 are brought to inputs of the first logic element IC4-CD XOR. The output of the first logic element IC4CD XOR is square pulse (−5 V +5 V −5 V) with duration 1 ms, positioned in time between the moments of switch of the second and the third comparators IC5-1 and IC5-2 from the low to the high level (see oscilloscopic record of outputs of the first voltage amplifier IC1 and of the first logic element IC4-CD XOR in FIG. 7; the recording was done using device Tektronix TDS 1001B).

Figure 8:
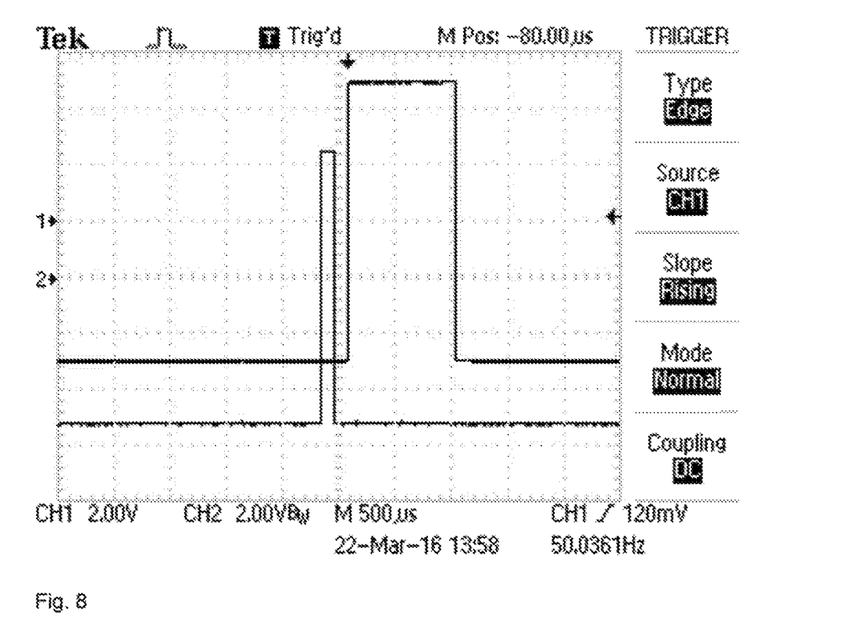
FIG. 8. Oscilloscopic record of outputs of logic elements IC4-CD XOR (upper line) and IC4-AB (lower line).

The second potentiometer P2 is set so that the fourth comparator IC2-3 switches to the high output level approximately 20 μs before the second comparator IC5-1 switches to the high level. The third potentiometer P3 is set so that the fifth comparator IC2-4 switches to the high level approximately 10 μs after the fourth comparator IC2-3 switches to a high output level. The outputs of the fourth and fifth comparators IC2-3 and IC2-4 are brought to inputs of the second logic element IC4-AB XOR. The output of the second logic element IC4-AB XOR is square pulse with duration of approximately 10 μs (−5 V+5 V −5 V) positioned in time between the moments of switch of the fourth and fifth comparators IC2-3 and IC2-4 from the low to the high level and thus, before rise of pulse provided in output of the first logic element IC4-CD XOR (see oscilloscopic record of outputs from logic elements IC4-CD and IC4-AB in FIG. 8).

Figure 9:
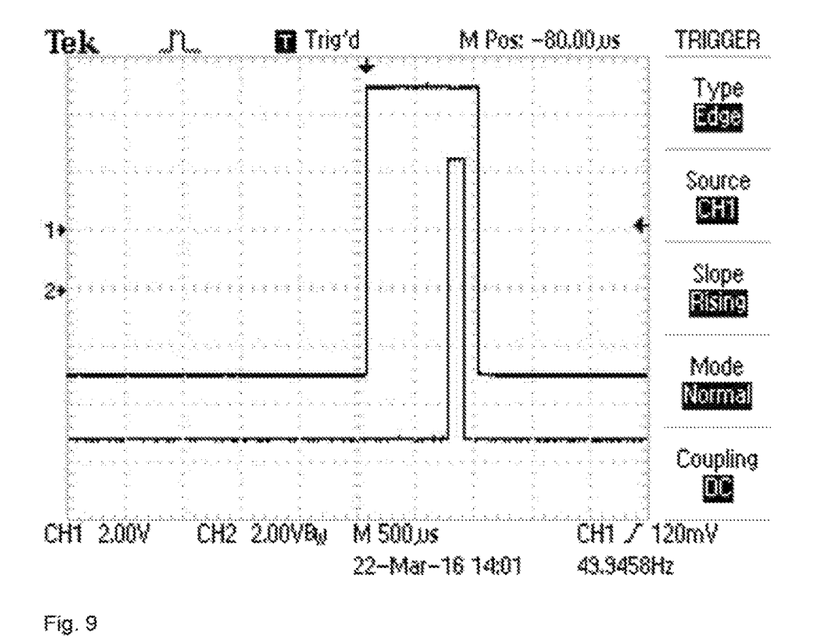
FIG. 9. Oscilloscopic record of outputs of logic elements IC4-CD XOR (upper line) and IC4-EF XOR(lower line).

The sixth potentiometer P6 is set so that the sixth comparator IC5-3 switches to the high output level approximately 20 μs before the third comparator IC5-2 switches to the high level. The seventh potentiometer P7 is set so that the seventh comparator IC5-4 switches to the high level approximately 10 μs after the sixth comparator IC5-3 switches to the high output level. Outputs from comparators IC5-3 and IC5-4 are brought to inputs from the third logic element IC4-EF XOR. The output from the third logic element IC4-EF XOR is square pulse with duration approximately 10 μs (−5 V+5 V −5 V) positioned in time between the moments of switch of comparators IC5-3 and IC5-4 from the low to the high level and thus, before the end of pulse provided on output from the first logic element IC4-CD XOR (see oscilloscopic record of outputs IC4-CD and IC4-EF in FIG. 9).

Pulses from logic elements IC4-CD, IC4-AB and IC4-EF XOR are brought to one of inputs of the first, second and third logic elements IC6-2, IC6-3 and IC6-4 AND. Because the high voltage level +5 V is brought to the second of their inputs from the eighth comparator IC2-2 in this phase of 60 Hz EMI, the pulses from the logic elements IC4-CD, IC4-AB and IC4-EF XOR are transferred unchanged to outputs of the first, second and third logic elements IC6-2, IC6-3 a IC6-4 AND.

The square pulse from the first logic element IC6-2AND with duration 1 ms and range −5 V to +5 V is modulated using the third resistor R3 and the eighth and the ninth potentiometers P8 and P9 to square pulse with range +600 to +900 mV, and it is brought through the second transistor T2 connected as emitor follower as pulse 0 to +300 mV to an electrode put on the tested surface. The surface is connected with the other electrode to a voltage divider with the fourth resistor R4. The voltage on the divider between the surface and the fourth resistor R4 is sensed using the third voltage follower IC8 with very high input impedance of order $10^{12}\Omega$. The output from the third voltage follower IC8 is brought to signal inputs of the sample-and-hold amplifiers IC10 and IC11.

The pulse from the second logic element IC6-3AND is brought to input of the first sample-and-hold amplifier IC10 which controls sampling of the signal input. Analogously the signal sampling produced by the sample-and-hold amplifier IC11 is controlled by a pulse from the third logic element IC6-4AND.

The pulses are set so that the first sample-and-hold amplifier IC10 samples voltage on the voltage divider immediately before one-millisecond 300 mV pulse is inserted on the tested surface and on the second sample-and-hold amplifier IC11 immediately before its end. Output from the both sample-and-hold amplifiers IC10 and IC11 keeps signal magnitude till the pulses are again inserted to inputs controlling signal sampling in the next positive semi-period 60 Hz EMI, thus for 20 ms in total.

The output of the first sample-and-hold amplifier IC10 is brought through two inverting amplifiers IC12A and IC12B which use the eleventh and twelfth potentiometers P11 and P12 to transform the output from the first sample-and-hold amplifier IC10 to value equal to output from the second sample-and-hold amplifier IC11 in case that it is necessary to set the zero output level for some surface conditions, e.g. the zero output level for dry surface is set for measurement of condensation on surface.

The output from the first sample-and-hold amplifier IC10 transformed in the amplifiers IC12-A and IC12-B is brought to inverting input of the first differential amplifier IC13A. Output from the second sample-and-hold amplifier IC11 is brought to non-inverting input of the first differential amplifier IC13A. This first differential amplifier IC13A is connected so that on output it produces the difference on inputs multiplied by ten times. Taking into account that the voltage on divider surface/R4 adjusted from effect of 60 Hz EMI can range from 0 mV (surface resistivity is infinite) to 300 mV (surface resistivity is zero) on application of 300 mV pulse, the voltage on output from the first differential amplifier IC13A ranges from 0 to 3 V. The low pass filter which consists of the fifth resistor R5 and third capacitor C3 connected to output of the first differential amplifier IC13A eliminates accidental jitter of signal caused by electromagnetic noise at frequencies higher than 60 Hz, if any, and particularly spikes related to partial pass of pulses from outputs of the second and the third logic elements IC6-3 and IC6-4 controlling signal sampling to outputs of the sample-and hold amplifiers IC10 and IC11. This low pass filter also limits the theoretical response rate of the equipment to approximately 0.06 s (after the relation $2*\pi*R5*C3$). The voltage follower IC13-B provides for low output impedance.

At the moment when the positive semi-period 60 Hz EMI finished, the first comparator IC2-1 switches to the high output level. The result is as follows:

Switch of the eighth comparator IC2-2 from the high to the low output level, and this is brought to one of two inputs of the logic elements IC6-2, IC6-3 and IC6-4 AND Gradual change of voltage in the first capacitor C1 from −5V to +5V with time factor R2*C1 (i.e. 10 μs).

Figure 10:
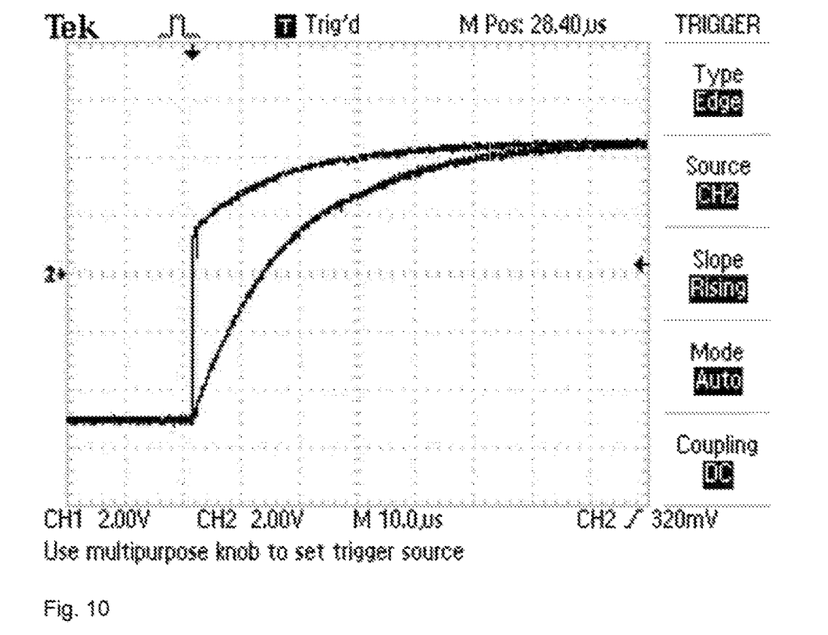
FIG. 10. Record from output of the first comparator IC2-1 (line with vertical transition) and voltage in C1/T1-gate.
Figure 11:
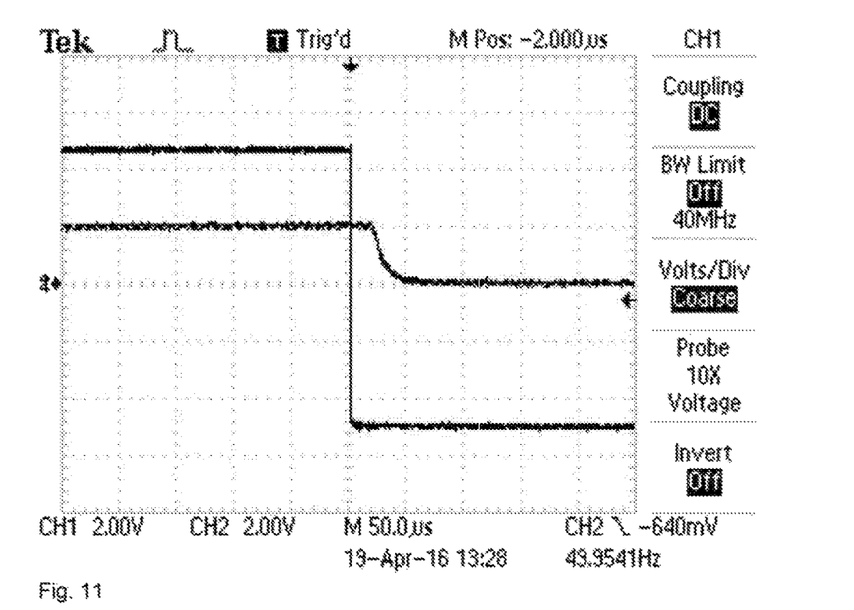
FIG. 11. Record from output of the eighth comparator IC2-2 (line with vertical transition) and voltage follower IC3 which follows voltage on the second capacitor C2.

The low output level of the eighth comparator IC2-2 provides that outputs of logic elements IC6-2, IC6-3 and IC6-4 AND will keep on the low level during the negative semi-period 60 Hz EMI regardless of the level of the second of its inputs which are connected to outputs from logic elements IC4-CD, IC4-AB and IC4-EF XOR. This measure is necessary because of gradual discharge of the second capacitor C2 which occur just at the moment when voltage in the first capacitor C1 reaches a threshold level to open the transistor T1 MOSFET of order 20 μs after switch of the first comparator IC2-1 to the high and of the eighth comparator IC2-2 the low output level; oscilloscopic records of potential on output from the first comparator IC2-1 and from the first capacitor C1 is in FIG. 10 and records from output of the eighth comparator IC2-2 and from the second voltage follower IC3 which follows voltage on the second capacitor C2 is in FIG. 11.

Figure 12:
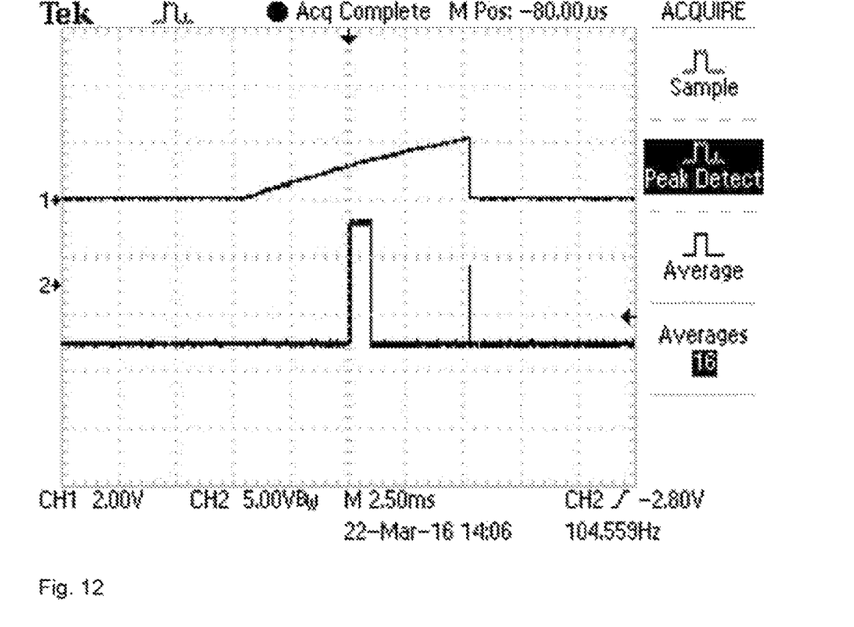
FIG. 12. Record from output of the second voltage follower IC3 following voltage on the second capacitor C2 (upper line) and output of logic element IC4-CD XOR (lower line).

After the transistor T1 MOSFET opened, very quick discharge of the second capacitor C2 occurs, and it results in appearance of short unrequired pulses in outputs of logic elements IC4-CD, IC4-AB and IC-4EF XOR on rise of negative semi-period 60 Hz EMI (see FIG. 12, short pulse with duration of approximately 200 ns is evident at the moment of discharge of the second capacitor C2 on output of the first logic element IC4CD XOR, as found in the measurement with higher time resolution). These pulses would affect function of the circuit because they would initiate sampling of signal from the divider fourth resistor R4/surface using the sample-and-hold amplifiers IC10 and IC11 in unrequired phase 60 Hz EMI non-synchronously with one-millisecond 300 mV pulse.

No change in state of any circuit components occurs during the rest of negative semi-period 60 Hz EMI, the signal level is kept by S&H amplifiers IC10 and IC11. The whole cycle described is repeated with rise of the next positive semi-period.

Possible Applications of Equipment for the Measurement of Quick Changes of Low Surface Conductivity of Dielectrics.

One possible application of the equipment is monitoring of changes in conductivity related to moistening of surface within change of relative moisture in environment and/or within moisture condensation. The function of DP has been compared with a commercial sensor of relative air moisture in two experimental arrangements, as described below. Resistivity in the voltage divider ($R_{div}$ in relation (1), or the fourth resistor R4 in diagram in FIG. 5) amounted to 50 MΩ. Amplitude of pulses applied amounted to 330 mV, thus the maximum output voltage was 3.3 V.

1) Slow Rise of Relative Moisture in Closed System

Figure 13:
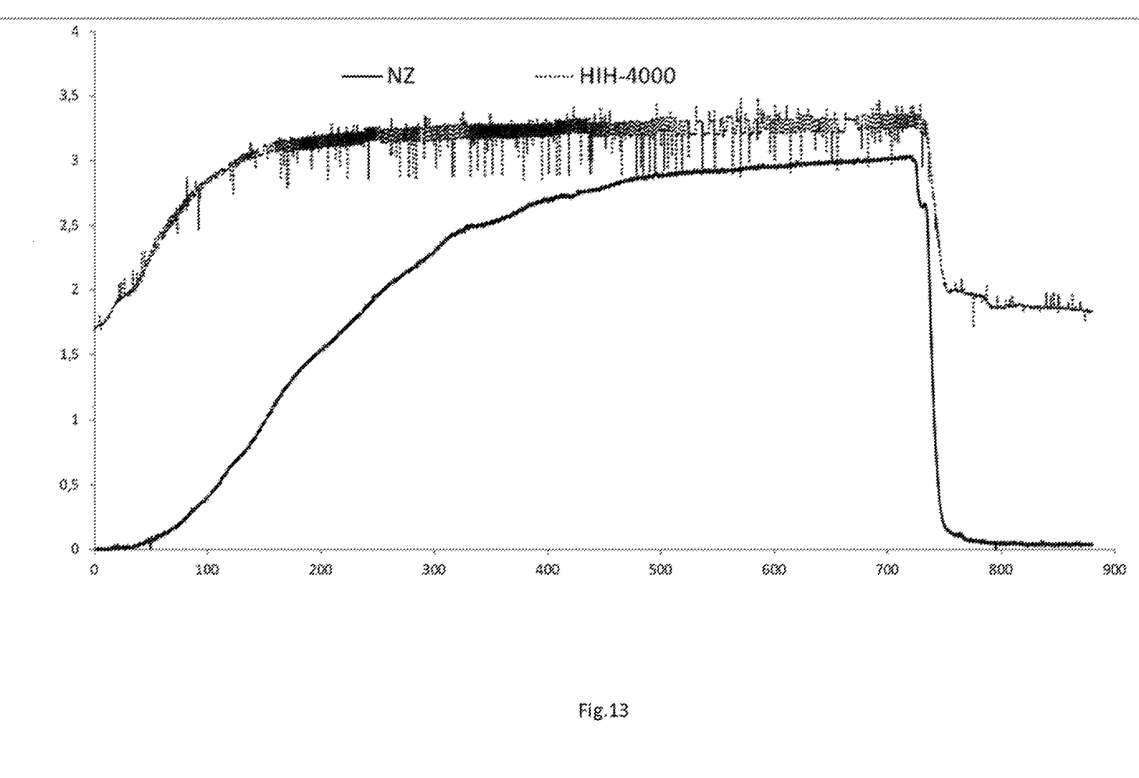
FIG. 13. Comparison of response of the suggested equipment and sensor HIH-4000 to increasing relative air moisture.

The sensor of the equipment (two flat copper electrodes 35 μm thick and 4 mm long, with gap 0.5 mm, fixed to surface of laminate FR4; the sensor was produced using technique common in production of printed circuit boards) and a commercial sensor RH (Honeywell HIH-4000) have been placed close one to another in the upper half of vertically oriented hollow and from-bottom-open thin-walled aluminium cylindrical case with height approximately 13 cm and diameter approximately 6 cm. A cup with approximately 20 ml of water was inserted in the lower part of the case in time t=0 and the hole in the lower part of the case was closed (water temperature and ambient temperature amounted to 23° C., relative air moisture according to sensor HIH-4000 in time t=0 was 30%). Water was removed off the case in time t=720 s and the bottom side of the case was kept open and in contact with ambient air. The record of the signal from the equipment and from the sensor HIH-4000 is in FIG. 13. It is evident that both the sensors respond to increasing ambient moisture even though the transmission functions RH—output voltage have different shape.

2) Dynamic Change of Relative Moisture and Condensation in Open System

Figure 14:
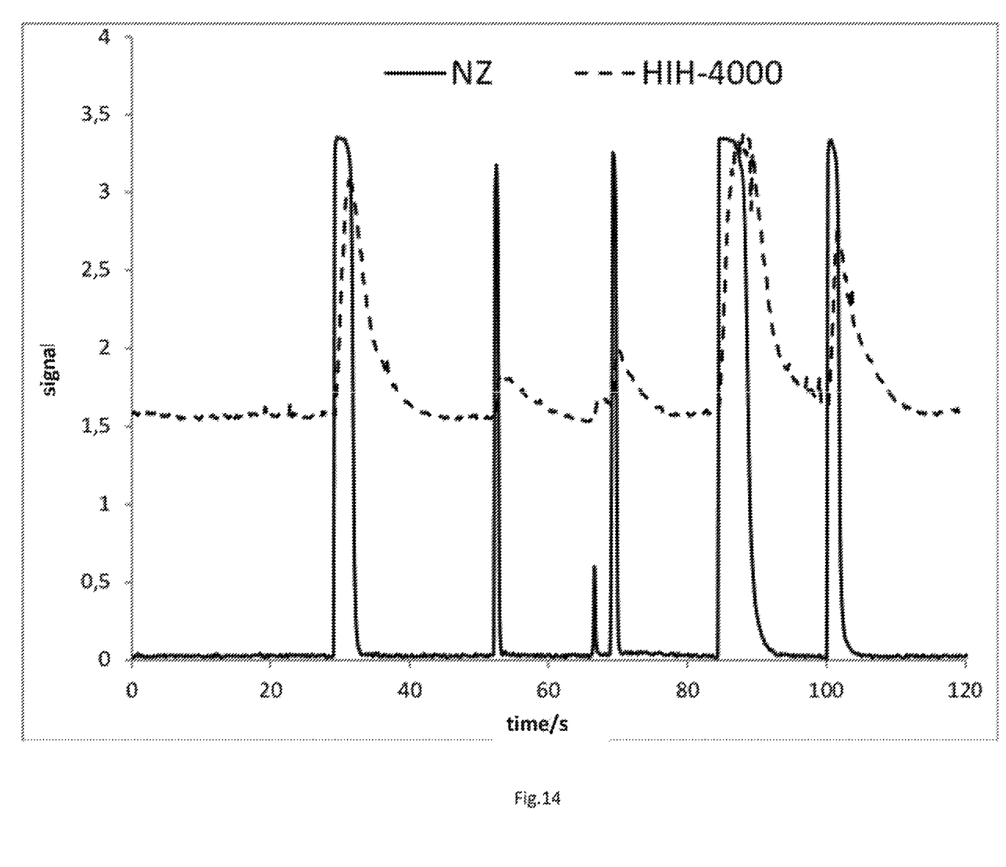
FIG. 14. Comparison of response of the suggested equipment and sensor HIH-4000 to air moisture breathed out from lungs.
Figure 15:
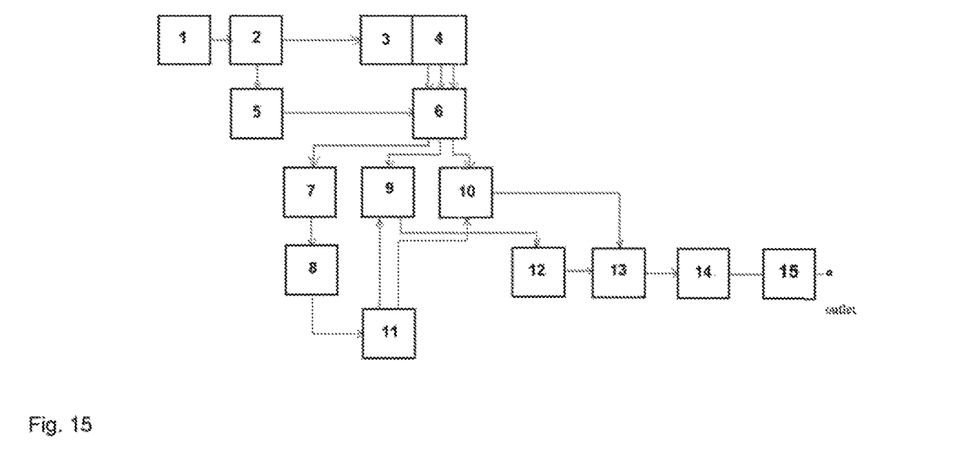
FIG. 15. Basic block diagram of the suggested equipment.

One method of how to achieve quick change of surface moisture is to expose it to human breathe (air exhaled from the lungs has up to 100% RH). An DP sensor and a RH commercial sensor (Honeywell HIH-4000) have been placed close one to another free in ambient laboratory air and they were exposed to six breathes with various intensity and duration which were applied one after another. The record of the signal from both the sensors is in FIG. 14.

It is evident that DP has overcome sensor HIH-400 in this case with quick response (the producer presents the time factor for sensor HIH-4000 at level of 15 s) and sensitivity. The advantage of DP also is that it can sense the course of moisture condensation on surface as well (sensor HIH-4000 has been specified just for non-condensating environment).

LIST OF REFERENCE SYMBOLS

C1 first capacitor
C2 second capacitor
C3 third capacitor
R1 first resistor
R2 second resistor
R3 third resistor
R4 fourth resistor
R5 fifth resistor
T1 transistor MOSFET
T2 second transistor
P1 first potentiometer
P2 second potentiometer
P3 third potentiometer
P4 fourth potentiometer
P5 fifth potentiometer
P6 sixth potentiometer
P7 seventh potentiometer
P8 eighth potentiometer
P9 ninth potentiometer
P10 tenth potentiometer
P11 eleventh potentiometer
P12 twelfth potentiometer
IC1 first voltage follower
IC2-1 first comparator
IC2-2 eighth comparator
IC2-3 fourth comparator
IC2-4 fifth comparator
IC3 second voltage follower
IC4-CD first logic element XOR
IC4-EF third logic element XOR
IC4-AB second logic element XOR
IC5-1 second comparator
IC5-2 third comparator
IC5-3 sixth comparator
IC5-4 seventh comparator
IC6-2 first logic element AND
IC6-3 second logic element AND
IC6-4 third logic element AND
IC8 third voltage follower
IC10 first sample-and-hold amplifier
IC11 second sample-and-hold amplifier
IC12-A first inverting amplifier
IC12-B second inverting amplifier
IC13-A first differential amplifier
IC13-B voltage follower
1 sensing element
2 block monitoring electromagnetic interference
3 comparative block for control of generation of time sequences
4 block for generation of pulses
5 comparative element
6 block of logic elements
7 block of modulation of pulses
8 block of voltage divider
9 first sample-and-hold amplifier
10 second sample-and-hold amplifier
11 block of voltage follower in divider
12 block of two inverting amplifiers connected in series
13 differential amplifier
14 block to eliminate accidental jitter of signal
15 output block with low impedance

The invention claimed is:

1. A method for measuring of quick changes of low surface conductivity of dielectrics under electromagnetic interference of line voltage distinguished by the fact that the measurement is based on a comparison measurement on a voltage divider and synchronisation of measuring pulses with periodic sinusoidal course of interference when voltage with pre-set parameters of square pulse is brought to a tested dielectric surface and potential is sampled in the voltage divider consisting of the dielectric surface measured and a resistor with preselected resistivity in certain time intervals both before application of the measuring pulse and immediately before its end, and then a value corresponding to a value measured without effect of electromagnetic interference 60 Hz EMI is derived based on a difference between values measured using a differential amplifier and a result is the possibility to measure quick changes of low surface conductivity of dielectric surface.

2. The method for measuring of quick changes of low surface conductivity of dielectrics according to claim 1, distinguished by the fact that voltage with parameters of square pulse in duration of 1 ms in each positive semi-period 60 Hz EMI forms the measuring pulses with periodic sinusoidal course of interference.

3. An equipment for measurement of quick changes of low surface conductivity of dielectrics under electromagnetic interference of line voltage based on the method of measurement of quick changes of low surface conductivity of dielectrics according to claim 1 distinguished by the fact that a block (2) monitoring electromagnetic interference is connected to a sensing element (1) monitoring electromagnetic interference, and a comparative block (3) for control of generation of time sequences and a block (4) for generation of pulses are connected to its first output, and an output of the block (4) are square pulses 1 ms/±5 V, and a first output 10 μs/±5 V and a second output 10 ρs/±5 V are connected to inputs of the block (6) of logic elements, and another output of the block (2) monitoring electromagnetic interference is connected to a comparative element (5), an output of which is connected to a fourth input of the block (6) of logic elements, and a first output of the block (6) of logic elements is connected through a block (7) for modulation of pulses with an output as pulse 0 to 300 mV to the tested surface in a block (8) of a voltage divider surface/divider-resistor where output from this block (8) of the voltage divider surface/resistor-divider is connected through a block (11) of a voltage follower to a divider with very high input impedance to signal inputs of a first sample-and-hold amplifier (9) and of a second sample-and-hold amplifier (10), and a second input for control of sampling of the first sample-and-hold amplifier (9) and a second input for control of sampling of the second sample-and-hold amplifier (10) are connected with corresponding outputs for control of sampling of the block (6) of logic elements, and output of the first sample-and-hold amplifier (9) is connected through a block (12) of two inverting amplifiers connected in series to inverting input of a differential amplifier (13), and output from the second sample-and-hold amplifier (10) is connected to its non-inverting input, and the differential amplifier (13) is connected through a block (14) to eliminate accidental jitter of signal and an output block (15) with low impedance to an output from the equipment.

4. The equipment for measurement of quick changes of low surface conductivity of dielectrics according to claim 3, distinguished by the fact that the sensing element (1) monitoring electromagnetic interference is a resistor.

5. The equipment for measurement of quick changes of low surface conductivity of dielectrics according to claim 3, distinguished by the fact that the sensing element (1) monitoring electromagnetic interference is a transformer connected with its primary winding to a mains voltage while its secondary winding is connected with one terminal to earthing of the equipment and with an other terminal to an input of the block monitoring electromagnetic interference.

6. The equipment for measurement of quick changes of low surface conductivity of dielectrics according to claim 3, distinguished by the fact that a first output from a first resistor (R1) is earthed, its second output is connected to non-inverting input of a first voltage follower (IC1), and inverting input of the first voltage follower is connected to its output and also to inverting input from a first comparator (IC2-1), the non-inverting input of which is connected through a center of a resistor divider with capacity 1 kΩ/50 kΩ to output of its comparator (IC2-1) and to earth, and output from the comparator (IC2-1) is connected through a second resistor (R2) through a first capacitor (C1) to earth and through a resistor with capacity 5Ω to voltage +5V and to an electrode of a gate transistor (T1) MOSFET which by an source electrode is earthed and by an drain electrode is connected to a centers of the divider consisting of a first potentiometer (P1) and an earthed second capacitor (C2) where the first potentiometer (P1) is connected through its second terminal to feeding voltage +5V, and non-inverting input of a second voltage follower (IC3), and its inverting input is connected to its output and through resistors with capacity 1 kΩ to non-inverting inputs of comparators (IC5-1), (IC5-2), (IC2-3), (IC2-4), (IC5-3) and (IC5-4), and output from the first comparator (IC2-1) is also connected to inverting input of an eighth comparator (IC2-2), and its output is connected through a divider to 1 kΩ/50 kΩ resistors to earth and through a 510 resistor to voltage +5V, and non-inverting input of this eighth comparator (IC2-2) is connected to its central node, and non-inverting inputs of the comparators (IC5-1), (IC5-2), (IC2-3), (IC2-4), (IC5-3) and (IC5-4) are connected to corresponding outputs of all comparators (IC5-1), (IC5-2), (IC2-3), (IC2-4), (IC5-3) and (IC5-4) through 100 kΩ resisters where a source of feeding voltage +5V is also connected through a 5 kΩ resistor, 1. and output from a second comparator (IC5-1) is connected to a first input of a first logic element (IC4-CD) XOR, and output from a third comparator (IC5-2) is connected to its second input, and output from a fourth comparator (IC2-3) is connected to the first input of the second logic element (IC4-AB) XOR, and output from a fifth comparator (IC2-4) is connected to its second input, and output from a sixth comparator (IC5-3) is connected to a first input of a third logic element (IC4-EF) XOR, and output from a seventh comparator (IC5-4) is connected to its second input, 2. and outputs from these logic elements (IC4-CD) and (IC4-AB) and (IC4-EF) XOR are connected one-by-one to a first inputs of logic elements (IC6-2), and (IC6-3) and (IC6-4) AND, and their second inputs are connected to output of the eighth comparator (IC2-2), 3. and adjustable centres of the potentiometers (P4 to P7) are connected to corresponding inverting inputs of the comparators (IC5-1), (IC5-2), (IC2-3), (IC2-4), (IC5-3) and (IC5-4) and these centres are connected with its terminals between voltage +5V and earth, 4. and output from a first logic element (IC6-2) AND is connected through a third resistor (R3) to the base of, a second transistor (T2) in function of emitter follower where the source of voltage +5V is connected through a eighth potentiometer (P8) and earth and centres of the both potentiometers (P8, P9) are connected through a ninth potentiometer (P9) and a emitter of a second transistor (T2) is connected through a 5 kΩ resistor to a source −5V and through a collector to a source +5V, and a contact measured surface is connected with its
   first terminal to the emitter of the second transistor (T2), and the contact measured surface is earthed with its second terminal through a fourth resistor (R4) and it is also connected to non-inverting input of a third voltage follower (IC8), and its output is connected to its inverting input and to signal input (IN) of the first sample-and-hold amplifier (9) and to signal input (IN) of the second sample-and-hold amplifier (10) where input (S/H) sample-and-hold of the first amplifier (IC10) is connected to output of a second logic element (106-3) AND and input (S/H) of the second sample-and-hold amplifier (IC11) is connected to output of a third logic element (IC6-4) AND,
   where output of the first sample-and-hold amplifier (IC10) is connected through a brush of a twelfth potentiometer (P12) with one output to, inverting input of a first inverting amplifier (IC12-A) and through a 10 kΩ resistor to its output and also to one output of a eleventh potentiometer (P11), and non-inverting input of the first inverting amplifier (IC12-A) is earthed, and the brush of the eleventh potentiometer (P11) is connected to inverting input of a second inverting amplifier (IC12-B) and through a 10 kΩ resistor to output of this second inverting amplifier (IC12-B) and also through a 1 kΩ resistor to inverting input of a first differential amplifier (IC13-A) and also through another 10 kΩ resistor to its output, and non-inverting inputs of the first and of the second inverting amplifier (IC12-A) and (IC12-B) are earthed, and non-inverting input of the first differential amplifier (IC13-A) is earthed through a 10 kΩ resistor and it is connected through a 1 kΩ resistor to output of the second sample-and-hold amplifier (IC11), and output of the first differential amplifier (IC13-A) is connected to a fifth resistor (R5), and a second output of the fifth resistor is connected through a third capacitor (C3) to earth and it is connected to non-inverting input of a voltage follower (IC13-B), and inverting input of the voltage follower is connected to its output, and this is output from the equipment.

\* \* \* \* \*